(12) United States Patent
Sukemori et al.

(10) Patent No.: US 11,817,836 B2
(45) Date of Patent: Nov. 14, 2023

(54) POWER AMPLIFYING MODULE

(71) Applicant: Murata Manufacturing Co., Ltd., Kyoto (JP)

(72) Inventors: Yoshiaki Sukemori, Kyoto (JP); Kenji Tahara, Kyoto (JP); Hideyuki Sato, Kyoto (JP); Hisanori Namie, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 204 days.

(21) Appl. No.: 17/125,227

(22) Filed: Dec. 17, 2020

(65) Prior Publication Data
US 2021/0203288 A1 Jul. 1, 2021

(30) Foreign Application Priority Data
Dec. 27, 2019 (JP) .................. 2019-237871

(51) Int. Cl.
*H03F 3/21* (2006.01)
*H03F 3/24* (2006.01)
*H03F 3/195* (2006.01)
*H03F 1/56* (2006.01)

(52) U.S. Cl.
CPC .............. *H03F 3/245* (2013.01); *H03F 1/56* (2013.01); *H03F 3/195* (2013.01); *H03F 2200/318* (2013.01); *H03F 2200/451* (2013.01)

(58) Field of Classification Search
CPC ................................. H03F 3/2176; H03F 3/191
USPC .................................................. 330/310, 302
See application file for complete search history.

(56) References Cited

U.S. PATENT DOCUMENTS

| | | | |
|---|---|---|---|
| 5,914,641 A * | 6/1999 | Yun ...................... | H03G 3/3042 330/285 |
| 6,724,252 B2 | 4/2004 | Ngo et al. | |
| 6,822,515 B2 * | 11/2004 | Ichitsubo ............ | H03G 3/3042 330/296 |
| 7,616,060 B2 * | 11/2009 | Yamamoto ............ | H03F 3/191 330/296 |
| 8,102,205 B2 | 1/2012 | Pletcher et al. | |
| 8,242,841 B2 * | 8/2012 | Zhang .................... | H03F 3/19 455/280 |
| 8,289,084 B2 * | 10/2012 | Morimoto ............ | H03F 3/195 330/296 |
| 8,417,201 B1 | 4/2013 | Schooley | |
| 8,643,433 B2 | 2/2014 | Ho et al. | |

(Continued)

*Primary Examiner* — Henry Choe
(74) *Attorney, Agent, or Firm* — Pearne & Gordon LLP

(57) ABSTRACT

A power amplifying module includes a first input terminal, a second input terminal, a first power amplifier, a stage matching circuit, a bypass line, and a second power amplifier. The first input terminal receives a first input signal in a first operation mode. The second input terminal receives a second input signal in a second operation mode which is different from the first operation mode. The first power amplifier amplifies the first input signal and outputs a first amplified signal. The stage matching circuit is disposed downstream of the first power amplifier and receives the first amplified signal. The bypass line outputs the second input signal to the inside of the stage matching circuit not through the first power amplifier. The second power amplifier is disposed downstream of the stage matching circuit, and amplifies the first amplified signal or the second input signal and outputs a second amplified signal.

20 Claims, 10 Drawing Sheets

(56) References Cited

U.S. PATENT DOCUMENTS

| | | |
|---|---|---|
| 8,718,582 B2 | 5/2014 | See et al. |
| 8,971,830 B2 | 3/2015 | Hadjichristos et al. |
| 9,590,569 B2 | 3/2017 | Thompson et al. |
| 2002/0070809 A1* | 6/2002 | Watanabe ............ H03F 3/1935 330/302 |

* cited by examiner

POWER AMPLIFYING MODULE

CROSS REFERENCE TO RELATED APPLICATION

This application claims priority from Japanese Patent Application No. 2019-237871 filed on Dec. 27, 2019. The content of this application is incorporated herein by reference in its entirety.

BACKGROUND OF THE DISCLOSURE

Field of the Disclosure

The present disclosure relates to a power amplifying module.

Description of the Related Art

Mobile communication terminals such as cellular phones use a power amplifying module which amplifies radio frequency (RF) signals transmitted to base stations. Such a power amplifying module may have multiple stages of power amplifiers to increase the gain in the high power mode in which high output is required. In contrast, in the low power mode in which low output is required, the gain of the power amplifying module needs to be reduced. In view of this point, for example, U.S. Pat. No. 6,724,252 describes a power amplifying module including multiple stages of amplifiers connected to each other in series and further including a signal line for bypassing the first-stage amplifier.

However, in the mode in which signals are amplified by using the bypass path, the power amplifying module described in U.S. Pat. No. 6,724,252 may fail to match the impedance between the bypass path and a downstream-stage power amplifier in certain usage conditions.

BRIEF SUMMARY OF THE DISCLOSURE

Accordingly, it is an object of the present disclosure to provide a power amplifying module which has a path for bypassing a power amplifier and which achieves a reduction in the number of devices for impedance matching between the bypass path and a downstream power amplifier and also achieves a reduction in conversion loss in the impedance conversion.

A power amplifying module according to one aspect of the present disclosure includes a first input terminal, a second input terminal, a first power amplifier, a stage matching circuit, a bypass line, and a second power amplifier. The first input terminal receives a first input signal in a first operation mode. The second input terminal receives a second input signal in a second operation mode which is different from the first operation mode. The first power amplifier amplifies the first input signal and outputs a first amplified signal. The stage matching circuit is disposed downstream of the first power amplifier and receives the first amplified signal. The bypass line outputs the second input signal to the inside of the stage matching circuit not through the first power amplifier. The second power amplifier is disposed downstream of the stage matching circuit, and amplifies the first amplified signal or the second input signal and outputs a second amplified signal.

According to the aspect, the bypass line is connected to a connection point in the inside of the stage matching circuit which performs impedance matching easily. Therefore, the impedance matching is improved in the mode in which signals, which are inputted to the bypass line, are amplified.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
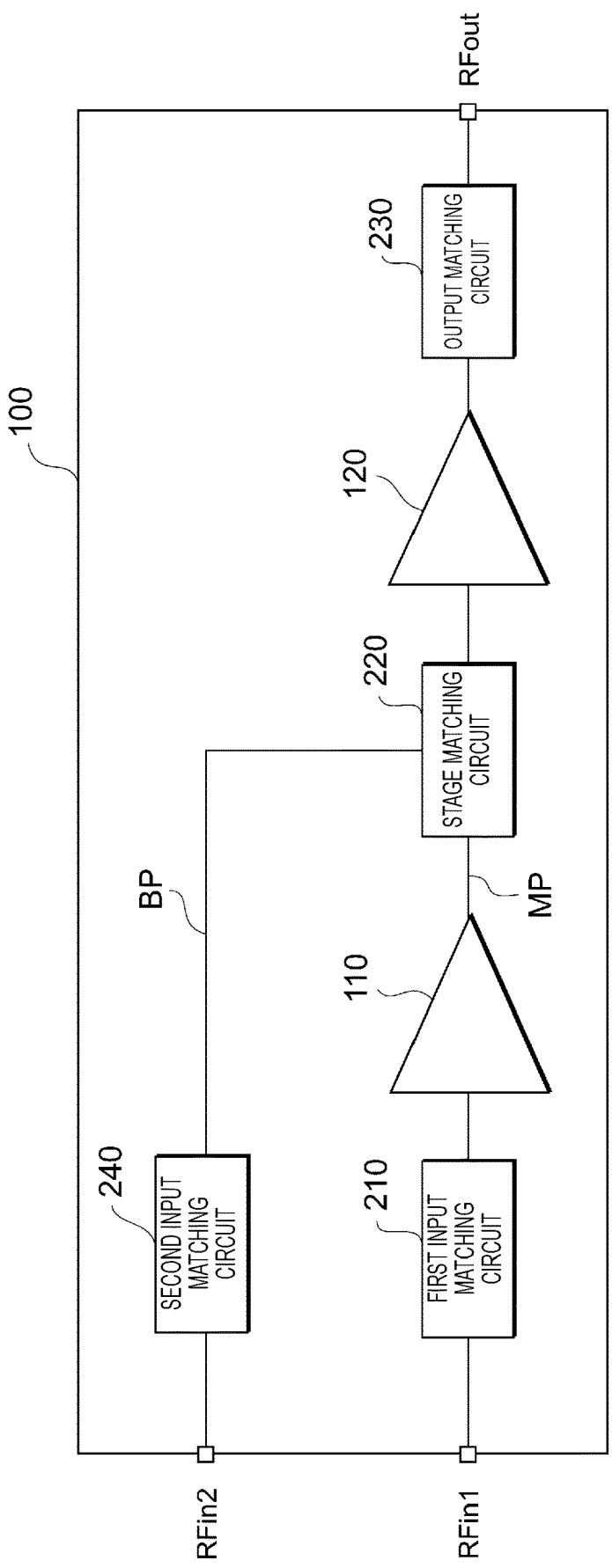
FIG. 1 is a schematic diagram illustrating the configuration of a power amplifying module according to an embodiment.

A preferable embodiment of the present disclosure will be described with reference to the accompanying drawings. In the figures, components designated with an identical reference numeral have an identical or similar configuration.

FIG. 1 is a schematic diagram illustrating the configuration of a power amplifying module 100 according to an embodiment. The power amplifying module 100 amplifies a radio frequency (RF) signal which is an input signal, and outputs an amplified signal, for example, in a mobile communication device such as a cellular phone. The frequency of the input signal is, for example, of the order of several gigahertz.

As illustrated in FIG. 1, the power amplifying module 100 includes, for example, a first power amplifier 110, a second power amplifier 120, a first input matching circuit 210, a second input matching circuit 240, a stage matching circuit 220, and an output matching circuit 230. The first power amplifier 110 and the second power amplifier 120 form two stages of power amplifiers. That is, the first power amplifier 110 forms the first-stage (driver-stage) power amplifier, and the second power amplifier 120 forms the downstream-stage (power-stage) power amplifier.

The power amplifying module 100 has a first input terminal RFin1, a second input terminal RFin2, and an output terminal RFout. It is assumed that the line connecting the first input terminal RFin1 to the output terminal RFout serves as a main line MP, and that the line from the second input terminal RFin2 to the stage matching circuit 220 serves as a bypass line BP. The bypass line BP is a line for bypassing the first power amplifier 110. The first input terminal RFin1 receives a first input signal which is an input signal in a first operation mode. The first operation mode may be, for example, the high power mode in which the output power level is high. The second input terminal RFin2 receives a second input signal which is an input signal in a second operation mode. The second operation mode may be, for example, the low power mode in which the output power level is low. The output terminal RFout outputs a second amplified signal obtained by amplifying the first input signal or the second input signal. In the first operation mode in which the output power level is high, saturation characteristics are desirable to achieve high efficiency. Similarly, in the second operation mode in which the output power level is low, linear characteristics are desirable because an amplifier desirably has a linear relationship between input signal and output signal. Alternatively, the first operation mode and the second operation mode may be the linear mode.

The first input terminal RFin1 is connected to the input end of the first power amplifier 110 through the first input matching circuit 210. The first input signal, which is inputted to the first input terminal RFin1, is received by the first power amplifier 110 through the first input matching circuit 210. The first power amplifier 110 amplifies the first input signal and outputs a first amplified signal. The first amplified signal is received by the second power amplifier 120 through the stage matching circuit 220.

The bypass line BP is connected, at its output end, to the inside of the stage matching circuit 220. "To be connected to the inside of a stage matching circuit" indicates, for example, a connection to a point disposed on the output side of a first passive element and on the input side of a second passive element on the main line MP. The first passive element is connected to the input end of the stage matching circuit, and is disposed in series on the main line MP. The second passive element is connected to the output end of the stage matching circuit, and is disposed in series on the main line MP. The second input signal, which is inputted to the second input terminal RFin2, is received by the second power amplifier 120 through the second input matching circuit 240 and the stage matching circuit 220. The bypass line indicates a path from the second input terminal RFin2 through the second input matching circuit 240 to the stage matching circuit 220. The case in which the second input matching circuit 240 is not included or the case in which the line itself has a matching-circuit function may be employed.

The output terminal RFout is connected to the output end of the second power amplifier 120 through the output matching circuit 230. The second power amplifier 120 amplifies the first amplified signal, which is supplied from the first power amplifier 110, or the second input signal, which is supplied from the second input terminal RFin2, and outputs the second amplified signal. The second amplified signal is supplied to the output terminal RFout.

The power amplifying module 100 may further include a switching device which has two inputs from the first input terminal RFin1 and the second input terminal RFin2 and which has two outputs to the input end of the first input matching circuit 210 and the input end of the second input matching circuit 240. The switching device is capable of switching connection between the first input terminal RFin1 and the second input terminal RFin2, and between the input end of the first input matching circuit 210 and the input end of the second input matching circuit 240.

Figure 2:
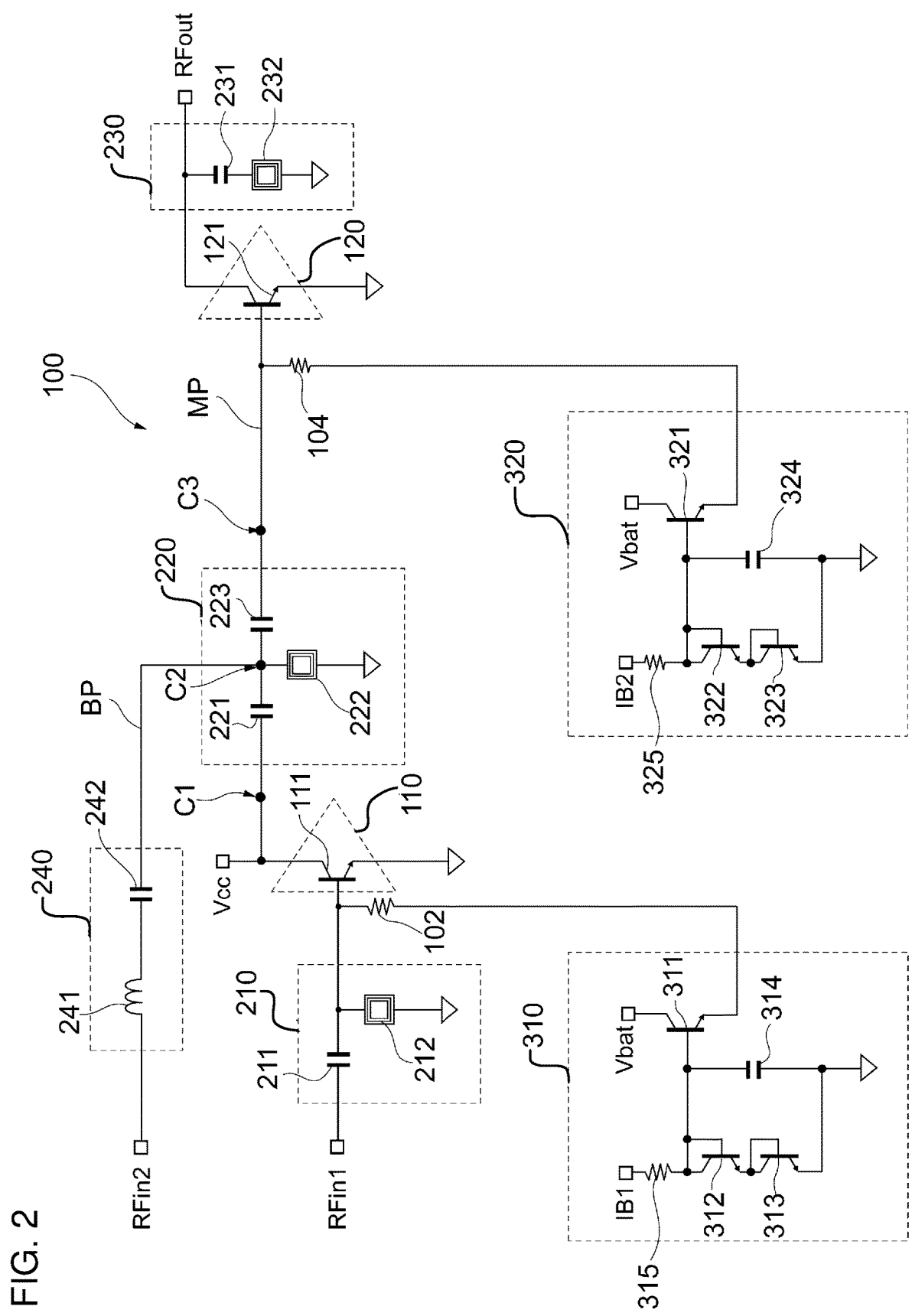
FIG. 2 is a schematic diagram illustrating the circuit configuration of a power amplifying module according to an embodiment.

FIG. 2 is a schematic diagram illustrating the circuit configuration of the power amplifying module 100 according to the embodiment. As illustrated in FIG. 2, the power amplifying module 100 includes, for example, the first power amplifier 110, the second power amplifier 120, the first input matching circuit 210, the second input matching circuit 240, the stage matching circuit 220, the output matching circuit 230, a first bias circuit 310, a second bias circuit 320, and resistance elements 102 and 104. As described above, the line connecting the first input terminal RFin1 to the output terminal RFout serves as the main line MP, and the line from the second input terminal RFin2 to the stage matching circuit 220 serves as the bypass line BP. The bypass line BP bypasses the first power amplifier 110. The bypass line BP is connected, at its output end, to the inside of the stage matching circuit 220. That is, the bypass line BP is connected, at its output end, to the connection point C2 disposed on the output side of a capacitor 221 and on the input side of a capacitor 223 on the main line MP.

The first input matching circuit 210 matches the impedance between the first input terminal RFin1 and the first power amplifier 110. The first input matching circuit 210 includes, for example, a capacitor 211 and an inductor 212. The capacitor 211 is connected, in series, to the main line MP connecting the first input terminal RFin1 to the output terminal RFout. Specifically, the capacitor 211 is connected, at its first end, to the first input terminal RFin1, and is connected, at its second end, to the base of a bipolar transistor 111. The inductor 212 is connected, in parallel, to the main line MP connecting the first input terminal RFin1 to the output terminal RFout. Specifically, the inductor 212 is connected, at its first end, to a wire connecting the second end of the capacitor 211 to the base of the bipolar transistor 111, and is grounded at its second end.

The first power amplifier 110 amplifies the first input signal, which is received from the first input terminal RFin1 through the first input matching circuit 210, and outputs the first amplified signal. The first power amplifier 110 includes, for example, the bipolar transistor 111. The bipolar transistor 111 is connected, at its base, to the second end of the capacitor 211 and a second end of the resistance element 102. The bipolar transistor 111 receives, at its base, the first input signal from the first input terminal RFin1 through the first input matching circuit 210. The capacitor 211 cuts the direct-current component from the first input signal. The bipolar transistor 111 is supplied, at its base, with a bias current from the first bias circuit 310 through the resistance element 102.

The bipolar transistor 111 is supplied, at its collector, with the power supply voltage Vcc. The bipolar transistor 111 is grounded at its emitter. The bipolar transistor 111 amplifies the first input signal, which is received at its base, and outputs the first amplified signal from its collector.

The first bias circuit 310 supplies the bias current to the base of the bipolar transistor 111. The first bias circuit 310 includes, for example, bipolar transistors 311, 312, and 313, a capacitor 314, and a resistance element 315. The resistance element 315 is supplied, at its first end, with a given current or voltage from a terminal IB1, and is connected, at its second end, to the collector of the bipolar transistor 312. The bipolar transistors 312 and 313 are connected to each other in series. Specifically, the collector and the base of the bipolar transistor 312 are connected to each other (hereinafter also referred to as diode-connected). The bipolar transistor 312 is connected, at its collector, to the second end of the resistance element 315, and is connected, at its emitter, to the collector of the bipolar transistor 313. The bipolar transistor 313 is diode-connected, and is grounded at its emitter. The capacitor 314 is connected, at its first end, to the base of the bipolar transistor 312, and is grounded at its second end. Due to the configuration described above, the first bias circuit 310 produces a given level of voltage (for example, about 2.8 V) at the collector of the bipolar transistor 312. Alternatively, instead of the bipolar transistors 312 and 313, diode devices may be used.

The bipolar transistor 311 is supplied, at its collector, with the power supply voltage Vbat, and is supplied, at its base, with the given level of voltage from the collector of the bipolar transistor 312. The bipolar transistor 311 is connected, at its emitter, to a first end of the resistance element 102. The bipolar transistor 311 supplies a bias current or voltage to the base of the bipolar transistor 111 through the resistance element 102.

The stage matching circuit 220 matches the impedance between the first power amplifier 110 and the second power amplifier 120. The stage matching circuit 220 includes, for example, the capacitors 221 and 223 and an inductor 222. The capacitor 221 is an exemplary first passive element (first capacitor) which is connected to the input end of the stage matching circuit 220, and which is disposed in series on the main line MP. The capacitor 223 is an exemplary second passive element (second capacitor) which is connected to the output end of the stage matching circuit 220 and which is disposed in series on the main line MP. Specifically, the capacitor 221 is connected, at its first end, to the collector of the bipolar transistor 111, and is connected, at its second end, to a first end of the capacitor 223. The capacitor 223 is connected, at its second end, to the base of a bipolar transistor 121. The inductor 222, which is an exemplary first inductor, is connected, at its first end, to the main line MP connecting the first input terminal RFin1 to the output terminal RFout, and is grounded at its second end. The devices included in the stage matching circuit 220, and its circuit configuration are not limited to those described above.

The second power amplifier 120 amplifies the first input signal, which is supplied from the first power amplifier 110, or the second input signal which is supplied from the second input terminal RFin2, and outputs the second amplified signal. The second power amplifier 120 includes, for example, the bipolar transistor 121. The bipolar transistor 121 is connected, at its base, to a second end of the resistance element 104. The bipolar transistor 121 receives, at its base, the first amplified signal from the first power amplifier 110 through the stage matching circuit 220. The bipolar transistor 121 is supplied, at its base, with a bias current from the second bias circuit 320 through the resistance element 104.

The bipolar transistor 121 is connected, at its collector, to the output terminal RFout. The output terminal RFout is supplied with the power supply voltage Vcc. The bipolar transistor 121 is grounded at its emitter. The bipolar transistor 121 amplifies the first amplified signal received at its base, and outputs the second amplified signal from its collector.

The second bias circuit 320 supplies a bias current to the base of the bipolar transistor 121. The second bias circuit 320 includes, for example, bipolar transistors 321, 322, and 323, a capacitor 324, and a resistance element 325. The resistance element 325 is supplied, at its first end, with a given current or voltage from a terminal IB2, and is connected, at its second end, to the collector of the bipolar transistor 322. The bipolar transistors 322 and 323 are connected to each other in series. Specifically, the collector and the base of the bipolar transistor 322 are connected to each other (hereinafter referred to as diode-connected). The bipolar transistor 322 is connected, at its collector, to the second end of the resistance element 325, and is connected, at its emitter, to the collector of the bipolar transistor 323. The bipolar transistor 323 is diode-connected, and is grounded at its emitter. The capacitor 324 is connected, at its first end, to the base of the bipolar transistor 322, and is grounded at its second end. Due to the configuration described above, the second bias circuit 320 produces a given level of voltage (for example, about 2.8 V) at the collector of the bipolar transistor 322. Alternatively, instead of the bipolar transistors 322 and 323, diode devices may be used.

The bipolar transistor 321 is supplied, at its collector, the power supply voltage Vbat, and is supplied, at its base, the given level of voltage produced at the collector of the bipolar transistor 322. The bipolar transistor 321 is connected, at its emitter, to a first end of the resistance element 104. The bipolar transistor 321 supplies a bias current or voltage to the base of the bipolar transistor 121 through the resistance element 104.

The output matching circuit 230 is, for example, a harmonic-wave termination circuit for class-F operation. The output matching circuit 230 includes, for example, a capacitor 231 and an inductor 232. The capacitor 231 is connected, in parallel, to the main line MP connecting the first input terminal RFin1 to the output terminal RFout. Specifically, the capacitor 231 is connected, at its first end, to a wire connecting the collector of the bipolar transistor 121 to the output terminal RFout, and is connected, at its second end, to a first end of the inductor 232. The inductor 232 is connected, in parallel, to the main line MP connecting the first input terminal RFin1 to the output terminal RFout. Specifically, the inductor 232 is connected, at its first end, to the second end of the capacitor 231, and is grounded at its second end. The devices included in the output matching circuit 230, and its circuit configuration are not limited to those described above.

The second input matching circuit 240 matches the impedance between the second input terminal RFin2 and the stage matching circuit 220. The second input matching circuit 240 includes, for example, an inductor 241 and a capacitor 242. The inductor 241 is an exemplary fifth inductor, and the capacitor 242 is an exemplary fifth capacitor. The inductor 241 and the capacitor 242 are connected, in series, to the bypass line BP connecting the second input terminal RFin2 to the stage matching circuit 220. Specifically, the inductor 241 is connected, at its first end, to the second input terminal RFin2, and is connected, at its second end, to a first end of the capacitor 242.

The second input terminal RFin2 may be open in the first operation mode (for example, the high power mode). This enables an influence, which is given by the second input matching circuit 240 to the characteristics of the stage matching circuit 220, to be reduced. For example, this enables reduction of ripples in the band of a signal that is to be amplified. Alternatively, the second input terminal RFin2 may be short-circuited in the first operation mode (high power mode). This enables the second input matching circuit 240 to be used as a part of a matching circuit between the first power amplifier 110 and the second power amplifier 120.

Figure 3:
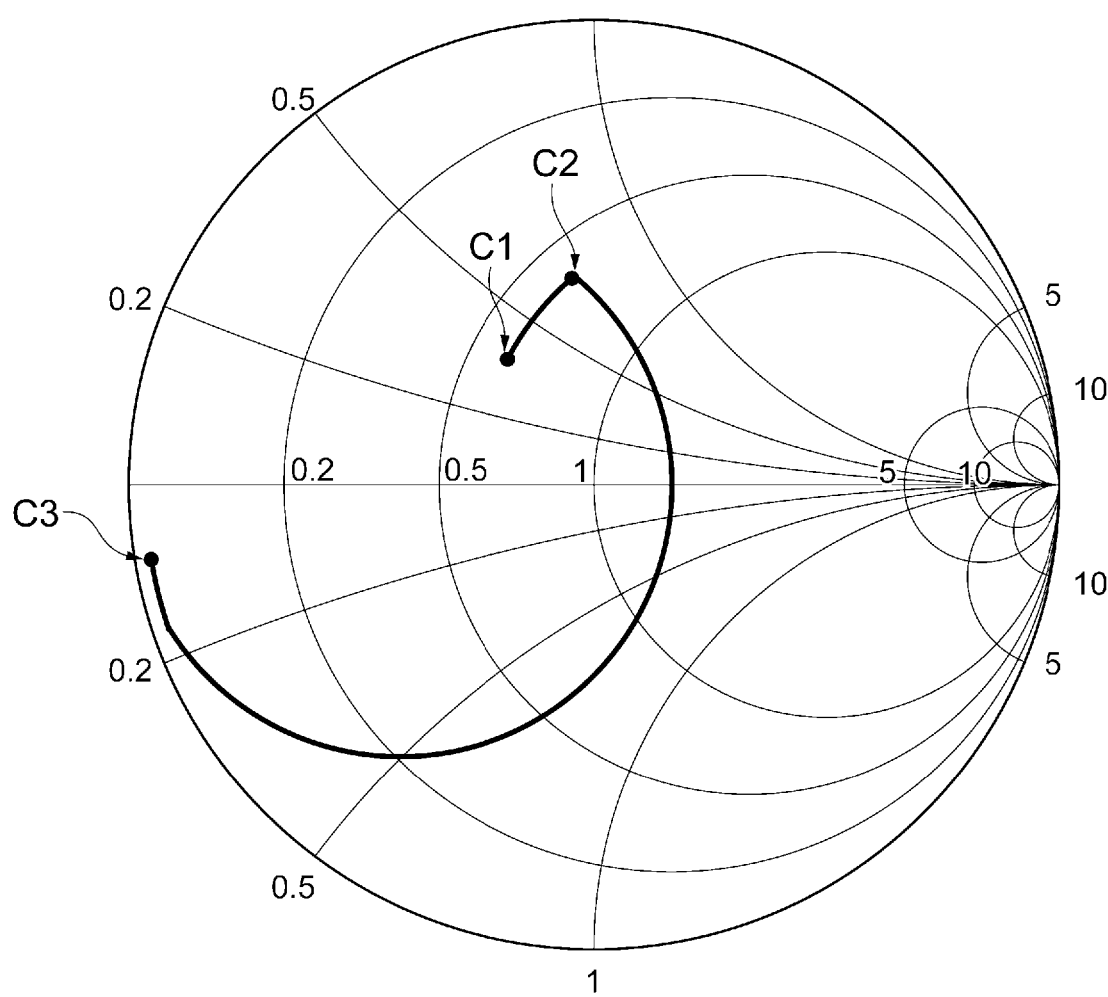
FIG. 3 is a diagram illustrating an exemplary Smith chart indicating impedances at connection points on the main line of a power amplifying module according to an embodiment.

FIG. 3 is a diagram illustrating an exemplary Smith chart indicating the impedance of the connection points on the main line MP of the power amplifying module 100 according to the embodiment. As illustrated in FIG. 3, the following points are defined: a connection point C1 between the collector of the bipolar transistor 111 and the first end of the capacitor 221; a connection point C2 between the second end of the capacitor 221 and the first end of the capacitor 223; a connection point C3 between the second end of the capacitor 223 and the base of the bipolar transistor 121. FIG. 3 is a Smith chart indicating the impedances at the connection points C1, C2, and C3. As illustrated in FIG. 3, the impedance at the connection point C3 is lower than those at the connection points C1 and C2. Therefore, the connection points C1 and C2 are preferable to the connection point C3 as a point at which the output end of the bypass line BP is connected to the main line MP.

Figure 4:
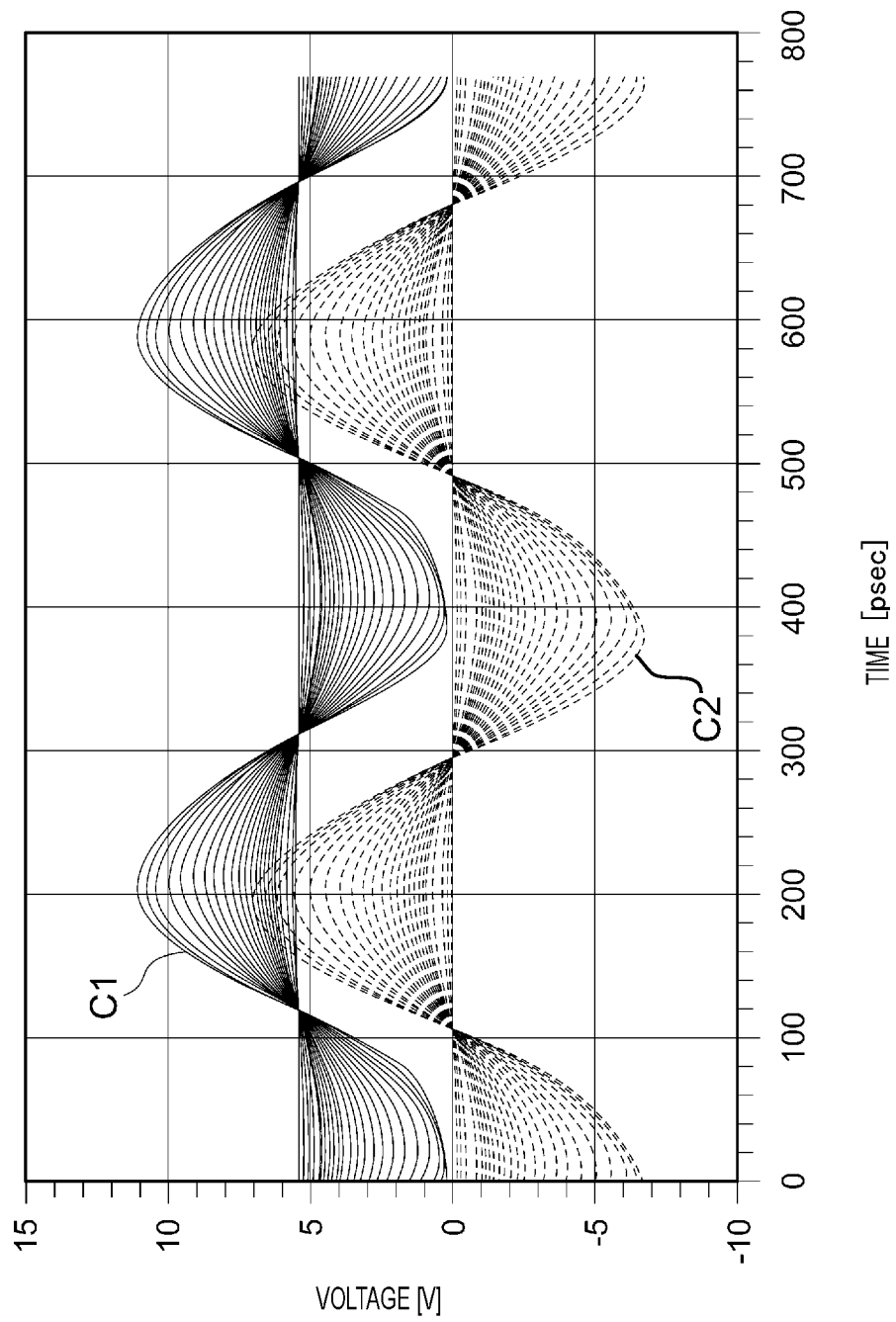
FIG. 4 is a diagram illustrating exemplary voltage changes at connection points on the main line of a power amplifying module according to an embodiment.

FIG. 4 is a diagram illustrating exemplary voltage changes at connection points on the main line MP of the power amplifying module 100 according to the embodiment. The reference character, C1, in FIG. 4 indicates the voltage at the connection point C1, and C2 in FIG. 4 indicates the voltage at the connection point C2. The connection point C1 is supplied with the power supply voltage Vcc. Thus, the voltage at the connection point C1 is relatively high. In contrast, the connection point C2 is separated from the connection point C1, which is supplied with the power supply voltage Vcc, with the capacitor 221 interposed in between. Thus, the voltage at the connection point C2 is lower than that at the connection point C1. Therefore, the connection point C2 is preferable to the connection point C1 as a point at which the output end of the bypass line BP is connected to the main line MP.

Figure 5:
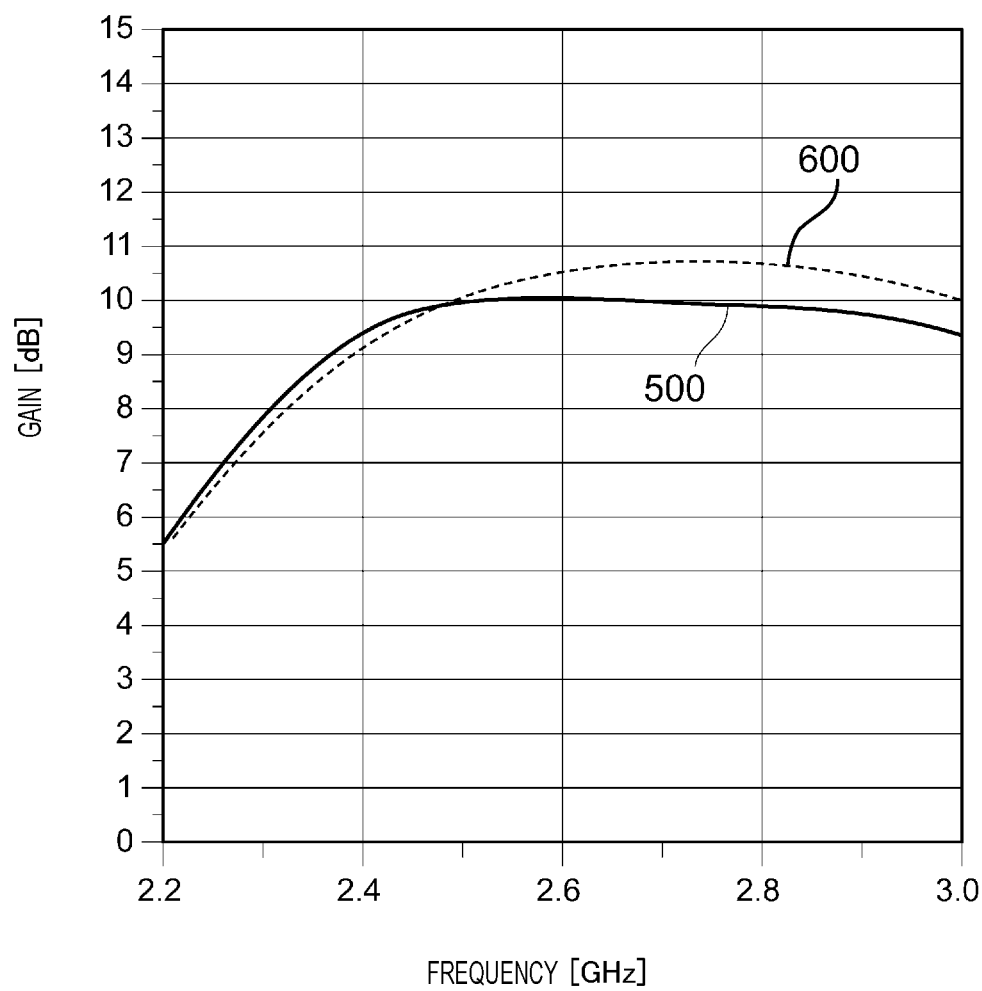
FIG. 5 is a diagram illustrating simulation results of gain, in the low power mode, of a power amplifying module according to an embodiment and gain, in the low power mode, of a power amplifying module according to a comparison example.

FIG. 5 is a diagram illustrating simulation results of gain, in the low power mode, of the power amplifying module 100 according to the embodiment and gain, in the low power mode, of a power amplifying module according to a comparison example. In the power amplifying module according to the comparison example, the bypass line BP is connected to the connection point C1 between the collector of the bipolar transistor 111 and the first end of the capacitor 221. In FIG. 5, the horizontal axis represents input signal frequency (GHz), and the vertical axis represents gain (dB). A line 500 in FIG. 5 indicates the gain, in the low power mode, of the power amplifying module 100 according to the embodiment. A line 600 indicates the gain, in the low power mode, of the power amplifying module according to the comparison example. As illustrated in FIG. 5, it is found that, especially in the frequency band of 2.5 to 3.0 GHz, the gain, in the low power mode, of the power amplifying module 100 according to the embodiment is lower than the gain, in the low power mode, of the power amplifying module according to the comparison example.

Other configuration examples of the stage matching circuit 220 will be described by referring to FIGS. 6A, 6B, and 6C.

Figure 6A:
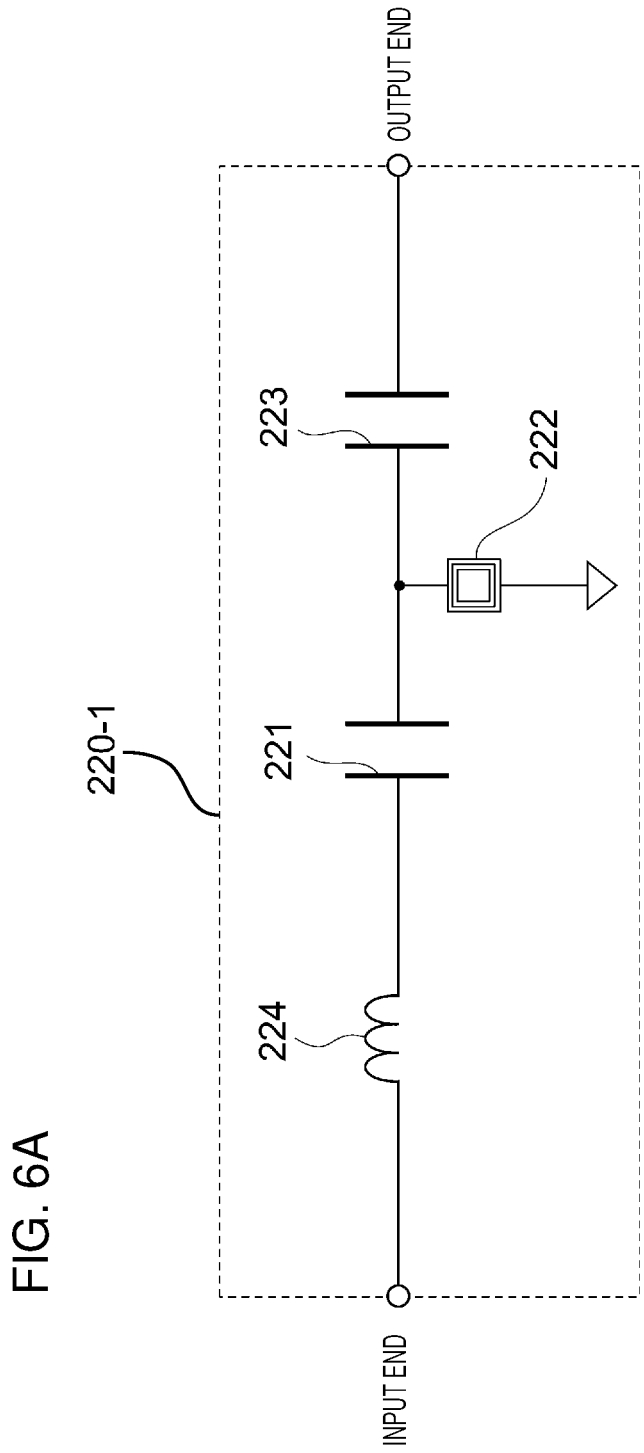
FIG. 6A is a diagram illustrating an exemplary stage matching circuit.

The stage matching circuit included in the power amplifying module 100 according to the embodiment may be a stage matching circuit 220-1 illustrated in FIG. 6A. As illustrated in FIG. 6A, the stage matching circuit 220-1 further includes an inductor 224 in addition to the devices included in the stage matching circuit 220. The inductor 224, which is an exemplary second inductor, is connected, at its first end, to the input end of the stage matching circuit 220-1, and is connected, at its second end, to the first end of the capacitor 221 (first capacitor).

Figure 6B:
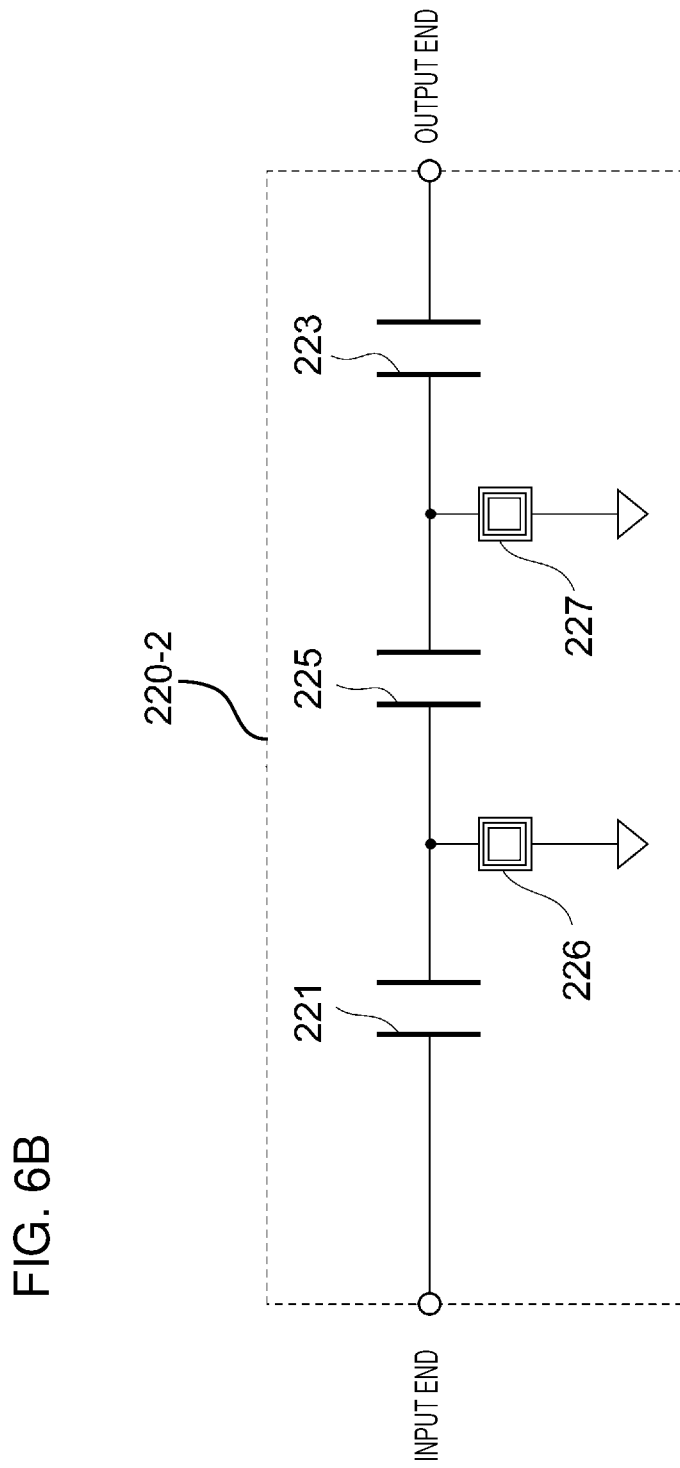
FIG. 6B is a diagram illustrating an exemplary stage matching circuit.

The stage matching circuit included in the power amplifying module 100 according to the embodiment may be a stage matching circuit 220-2 illustrated in FIG. 6B. As illustrated in FIG. 6B, the stage matching circuit 220-2 further includes a capacitor 225, an inductor 226, and an inductor 227 in addition to devices included in the stage matching circuit 220. The capacitor 225, which is an exemplary third capacitor, is disposed in series on the main line MP between the capacitor 221 (first capacitor) and the capacitor 223 (second capacitor). That is, the capacitor 225 is connected, at its first end, to the second end of the capacitor 221 (first capacitor), and is connected, at its second end, to the first end of the capacitor 223 (second capacitor). The inductor 226, which is an exemplary third inductor, is connected, at its first end, between the capacitor 221 (first capacitor) and the capacitor 225 (third capacitor) on the main line MP, and is grounded at its second end. The inductor 227, which is an exemplary fourth inductor, is connected, at its first end, between the capacitor 225 (third capacitor) and the capacitor 223 (second capacitor) on the main line MP, and is grounded at its second end.

Figure 6C:
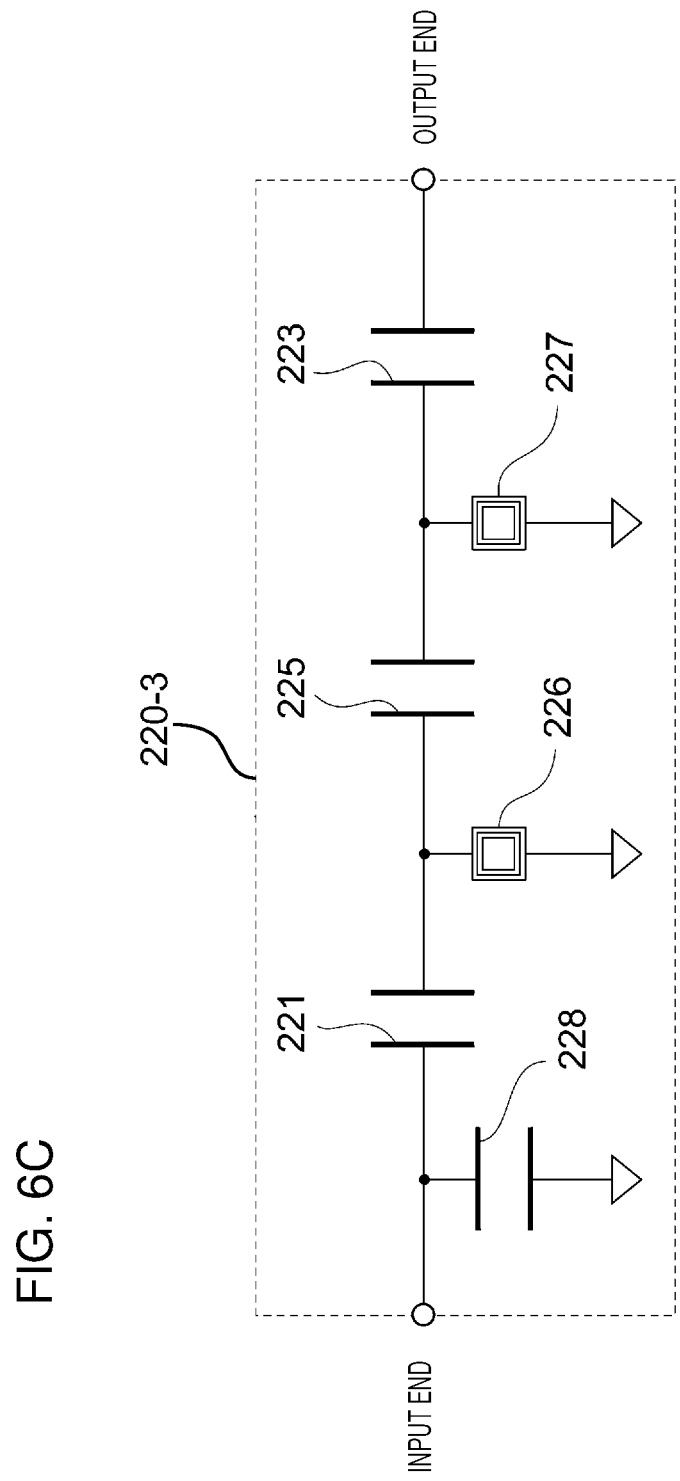
FIG. 6C is a diagram illustrating an exemplary stage matching circuit.

The stage matching circuit included in the power amplifying module 100 according to the embodiment may be a stage matching circuit 220-3 illustrated in FIG. 6C. As illustrated in FIG. 6C, the stage matching circuit 220-3 further includes a capacitor 228 in addition to the devices included in the stage matching circuit 220-2. The capacitor 228, which is an exemplary fourth capacitor, is connected, at its first end, to the line between the input end of the stage matching circuit 220-3 and the capacitor 221 (first capacitor) on the main line MP, and is grounded at its second end.

Other configuration examples of the second input matching circuit 240 will be described by referring to FIGS. 7A and 7B.

Figure 7A:
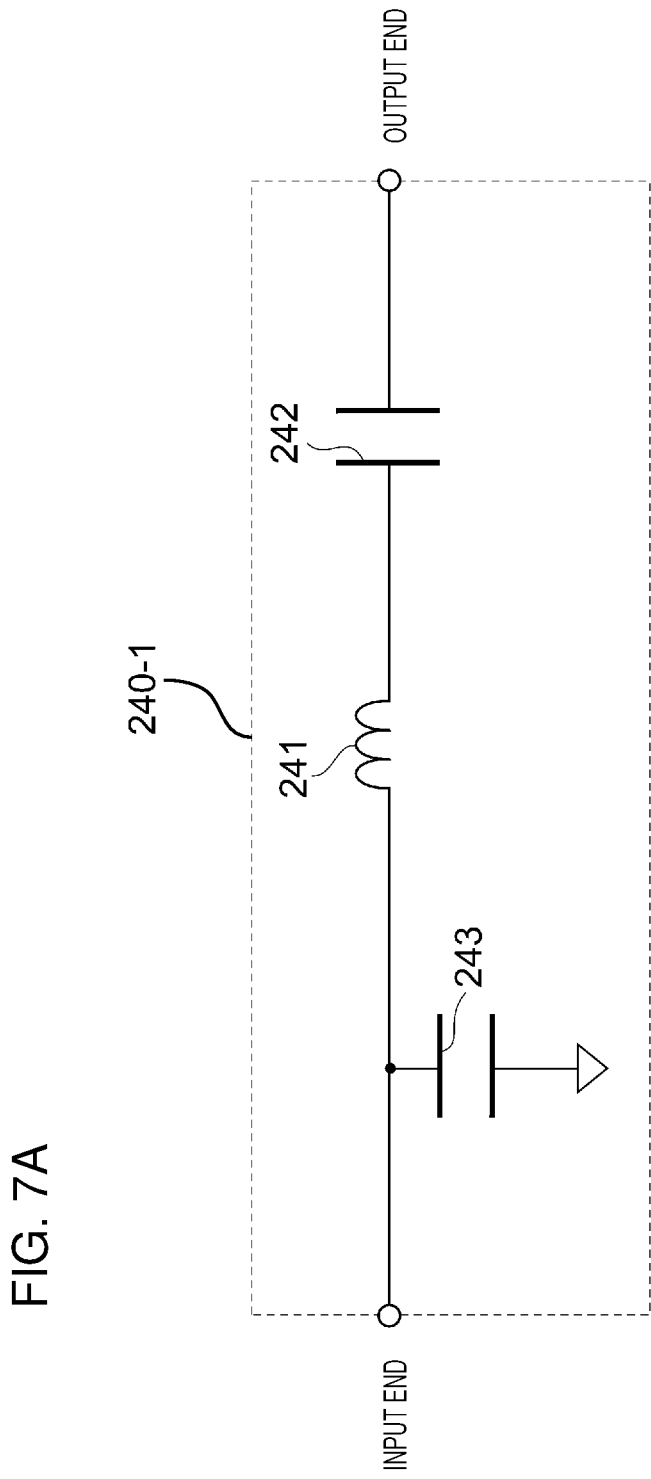
FIG. 7A is a diagram illustrating an exemplary second input matching circuit.

The second input matching circuit (matching circuit) included in the power amplifying module 100 according to the embodiment may be a second input matching circuit 240-1 illustrated in FIG. 7A. As illustrated in FIG. 7A, the second input matching circuit 240-1 further includes a capacitor 243 in addition to the devices included in the second input matching circuit 240. The capacitor 243, which is an exemplary sixth capacitor, is connected, at its first end, between the input end of the second input matching circuit 240-1 and the first end of the inductor 241 (fifth inductor), and is grounded at its second end.

Figure 7B:
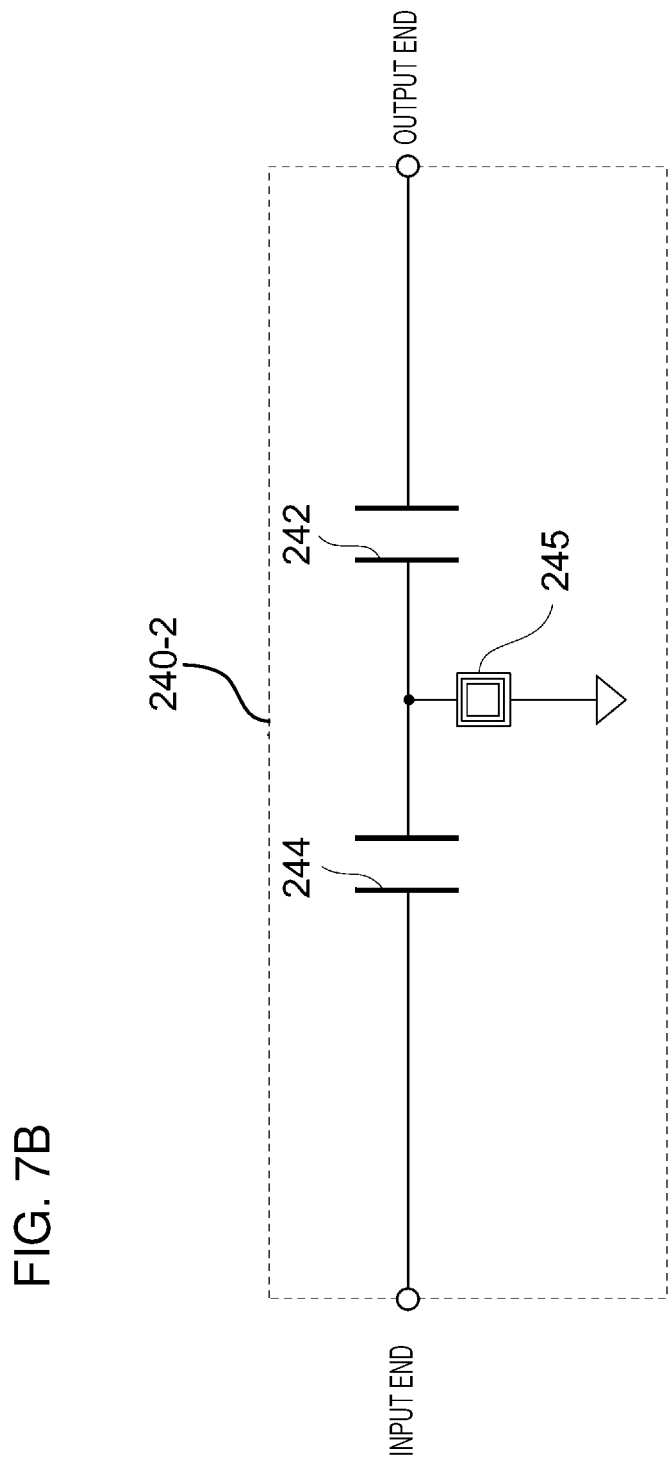
FIG. 7B is a diagram illustrating an exemplary second input matching circuit.

The second input matching circuit (matching circuit) included in the power amplifying module 100 according to the embodiment may be a second input matching circuit 240-2 illustrated in FIG. 7B. As illustrated in FIG. 7B, the second input matching circuit 240-2 further includes a capacitor 244 and an inductor 245 in addition to the capacitor 242 (fifth capacitor) included in the second input matching circuit 240. The capacitor 244, which is an exemplary seventh capacitor, is connected, at its first end, to the input end of the second input matching circuit 240-2, and is connected, at its second end, to the first end of the capacitor 242 (fifth capacitor). The inductor 245, which is an exemplary sixth inductor, is connected, at its first end, between the capacitor 244 (seventh capacitor) and the capacitor 242 (fifth capacitor) on the bypass line, and is grounded at its second end.

The power amplifying module according to the embodiment of the present disclosure is described above. The power amplifying module according to the embodiment includes a first input terminal, a second input terminal, a first power amplifier, a stage matching circuit, a bypass line, and a second power amplifier. The first input terminal receives a first input signal in a first operation mode. The second input terminal receives a second input signal in a second operation mode which is different from the first operation mode. The first power amplifier amplifies the first input signal and outputs a first amplified signal. The stage matching circuit is disposed downstream of the first power amplifier and receives the first amplified signal. The bypass line outputs the second input signal to the inside of the stage matching circuit not through the first power amplifier. The second power amplifier is disposed downstream of the stage matching circuit, and amplifies the first amplified signal or the second input signal and outputs a second amplified signal. Thus, the bypass line is connected to a connection point inside the stage matching circuit which performs impedance matching easily. Therefore, the number of devices for impedance matching in the mode, in which a signal received by the bypass line is amplified, may be reduced, and the conversion loss due to the impedance conversion may be reduced.

In the power amplifying module described above, the stage matching circuit may include a first passive element and a second passive element. The first passive element may be connected to the input end of the stage matching circuit, and may be disposed in series on a main line. The main line may be a line on which the first power amplifier, the stage matching circuit, and the second power amplifier are disposed. The second passive element may be connected to the output end of the stage matching circuit and may be disposed in series on the main line. The bypass line may have the output end connected to a point on the main line. The point may be disposed on the output side of the first passive element and on the input side of the second passive element. Thus, the bypass line is connected to the connection point inside the stage matching circuit which performs impedance matching easily. Therefore, the number of devices for impedance matching in the mode, in which a signal received by the bypass line is amplified, may be reduced, and the conversion loss due to the impedance conversion may be reduced.

In the power amplifying module described above, the first passive element may be a first capacitor. The second passive element may be a second capacitor. This easily achieves a desired impedance through the impedance conversion performed by the stage matching circuit.

In the power amplifying module described above, the stage matching circuit may further include a first inductor that has a first end connected between the first capacitor and the second capacitor on the main line and that has a second end being grounded. This easily achieves a desired impedance through the impedance conversion performed by the stage matching circuit.

In the power amplifying module described above, the stage matching circuit may further include a second inductor that is connected to the main line in series between the input end of the stage matching circuit and the first capacitor on the main line. This easily achieves a desired impedance through the impedance conversion performed by the stage matching circuit.

In the power amplifying module described above, the stage matching circuit may further include a third capacitor, a third inductor, and a fourth inductor. The third capacitor may be disposed in series on the main line between the first capacitor and the second capacitor on the main line. The third inductor may have a first end connected between the first capacitor and the third capacitor on the main line and may have a second end being grounded. The fourth inductor may have a first end connected between the third capacitor and the second capacitor on the main line and may have a second end being grounded. This easily achieves a desired impedance through the impedance conversion performed by the stage matching circuit.

In the power amplifying module described above, the stage matching circuit may further include a fourth capacitor that has a first end connected to a line between the input end of the stage matching circuit and the first capacitor on the main line and that has a second end being grounded. This easily achieves a desired impedance through the impedance conversion performed by the stage matching circuit.

The power amplifying module described above may further include a matching circuit that is disposed on the bypass line. This easily achieves a desired impedance through the impedance conversion performed by the matching circuit disposed on the bypass line.

In the power amplifying module described above, the matching circuit may include a fifth capacitor and a fifth inductor that are disposed in series on the bypass line. This easily achieves a desired impedance through the impedance conversion performed by the matching circuit disposed on the bypass line.

In the power amplifying module described above, the matching circuit may further include a sixth capacitor that has a first end connected between the input end of the matching circuit and the fifth inductor on the bypass line and that has a second end being grounded. This easily achieves a desired impedance through the impedance conversion performed by the matching circuit disposed on the bypass line.

In the power amplifying module described above, the matching circuit may further include a fifth capacitor and a seventh capacitor, and a sixth inductor. The fifth capacitor and the seventh capacitor may be disposed in series on the bypass line. The sixth inductor may have a first end connected between the fifth capacitor and the seventh capacitor on the bypass line and may have a second end being grounded. This easily achieves a desired impedance through the impedance conversion performed by the matching circuit disposed on the bypass line.

In the power amplifying module described above, the power amplifying module may further operate in the first operation mode and the second operation mode. In the first operation mode, the first power amplifier and the second power amplifier may have a saturation characteristic. In the second operation mode, the second power amplifier may have a linear characteristic. This easily achieves a desired impedance through the impedance conversion performed by the matching circuit disposed on the bypass line.

In the power amplifying module described above, the power amplifying module may further operate in the first operation mode and the second operation mode. In the first operation mode, the first power amplifier and the second power amplifier may have a linear characteristic. In the second operation mode, the second power amplifier may have a linear characteristic. This easily achieves a desired impedance through the impedance conversion performed by the matching circuit disposed on the bypass line.

The embodiment is described above for ease of understanding of the present disclosure, not for limitation of interpretation of the present disclosure. The components included in the embodiment, their positions, materials, conditions, shapes, sizes and the like are exemplary, and are not limiting and may be changed appropriately. Partial replacement and combination of the configurations of different embodiments may be made.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A power amplifying module comprising:
    a first input terminal that receives a first radio frequency input signal in a first operation mode;
    a second input terminal that receives a second radio frequency input signal in a second operation mode, the second operation mode being different from the first operation mode;
    a first power amplifier that amplifies the first radio frequency input signal and outputs a first amplified signal;
    a stage matching circuit that is disposed downstream of the first power amplifier and that receives the first amplified signal;
    a bypass line that bypasses the first power amplifier and outputs the second radio frequency input signal to an inside of the stage matching circuit; and
    a second power amplifier that is disposed downstream of the stage matching circuit and that amplifies the first amplified signal or the second radio frequency input signal, and outputs a second amplified signal.

2. The power amplifying module according to claim 1, wherein the stage matching circuit includes
    a first passive element that is connected to an input end of the stage matching circuit and that is disposed in series on a main line, the main line being a line on which the first power amplifier, the stage matching circuit, and the second power amplifier are disposed, and
    a second passive element that is connected to an output end of the stage matching circuit and that is disposed in series on the main line, and
    wherein the bypass line has an output end connected to a point on the main line, the point being disposed on an output side of the first passive element and on an input side of the second passive element.

3. The power amplifying module according to claim 2, wherein the main line connects the first input terminal and an output terminal of the power amplifying module.

4. The power amplifying module according to claim 2, wherein the first passive element is a first capacitor, and wherein the second passive element is a second capacitor.

5. The power amplifying module according to claim 4, wherein the stage matching circuit further includes a first inductor having a first end connected between the first capacitor and the second capacitor on the main line and a second end being grounded.

6. The power amplifying module according to claim 5, wherein the stage matching circuit further includes a second inductor that is connected in series between the input end of the stage matching circuit and the first capacitor.

7. The power amplifying module according to claim 4, wherein the stage matching circuit further includes
    a third capacitor that is connected in series between the first capacitor and the second capacitor,
    a third inductor having a first end connected between the first capacitor and the third capacitor on the main line and a second end being grounded, and
    a fourth inductor having a first end connected between the third capacitor and the second capacitor on the main line and a second end being grounded.

8. The power amplifying module according to claim 7, wherein the stage matching circuit further includes a fourth capacitor having a first end connected to a line between the input end of the stage matching circuit and the first capacitor on the main line and a second end being grounded.

9. The power amplifying module according to claim 1, further comprising:
    a matching circuit that is disposed on the bypass line.

10. The power amplifying module according to claim 9, wherein the stage matching circuit includes a fifth capacitor and a fifth inductor that are disposed in series on the bypass line.

11. The power amplifying module according to claim 10, wherein the stage matching circuit further includes a sixth capacitor having a first end connected between an input end of the stage matching circuit and the fifth inductor on the bypass line and a second end being grounded.

12. The power amplifying module according to claim 9, wherein the stage matching circuit further includes
    a fifth capacitor and a seventh capacitor that are disposed in series on the bypass line, and
    a sixth inductor having a first end connected between the fifth capacitor and the seventh capacitor on the bypass line and a second end being grounded.

13. The power amplifying module according to claim 1, wherein the power amplifying module operates in the first operation mode and the second operation mode,
    wherein, in the first operation mode, the first power amplifier and the second power amplifier have a saturation characteristic, and
    wherein, in the second operation mode, the second power amplifier has a linear characteristic.

14. The power amplifying module according to claim 1, wherein the power amplifying module operates in the first operation mode and the second operation mode,
    wherein, in the first operation mode, the first power amplifier and the second power amplifier have a linear characteristic, and
    wherein, in the second operation mode, the second power amplifier has a linear characteristic.

15. The power amplifying module according to claim 1, wherein the bypass line connects the second input terminal and the stage matching circuit.

16. The power amplifying module according to claim 1, further comprising:
    a first input matching circuit that is disposed on the bypass line, and
    a second input matching circuit that is disposed on the bypass line.

17. The power amplifying module according to claim 16, further comprising a switch configured to switch connection between the first input terminal and an input end of the first input matching circuit and between the second input terminal and an input end of the second input matching circuit.

18. The power amplifying module according to claim 1, wherein the second power amplifier outputs the second amplified signal to an output terminal.

19. The power amplifying module according to claim 18, further comprising:
    an output matching circuit that connects an output of the second power amplifier to the output terminal.

20. The power amplifying module according to claim 19, wherein the output matching circuit includes an eighth capacitor and a seventh inductor, the eighth capacitor being connected in parallel to the main line connecting the first input terminal to the output terminal.

* * * * *